United States Patent [19]

Kilby et al.

[11] 4,021,323

[45] May 3, 1977

[54] SOLAR ENERGY CONVERSION

[75] Inventors: Jack S. Kilby, Dallas, Tex.; Jay W. Lathrop, Clemson, S.C.; Wilbur A. Porter, College Station, Tex.

[73] Assignee: Texas Instruments Incorporated, Dallas, Tex. ; a part interest

[22] Filed: July 28, 1975

[21] Appl. No.: 599,473

[52] U.S. Cl. .......................... 204/129; 136/89 AC; 204/128; 204/266; 204/278; 204/192 S; 29/572; 156/625; 429/7; 429/17; 429/21

[51] Int. Cl.[2] .................. C25B 1/02; H01L 31/06; C25B 5/00

[58] Field of Search ................. 136/89, 86 C, 86 E; 204/128, 129, 266, 278

[56] References Cited

UNITED STATES PATENTS

| | | | |
|---|---|---|---|
| 2,572,079 | 10/1951 | von Hippel et al. | 136/89 |
| 3,025,335 | 3/1962 | Ralph | 136/89 |
| 3,236,691 | 2/1966 | Reger et al. | 136/86 E |
| 3,350,775 | 11/1967 | Iles | 29/572 |
| 3,615,854 | 10/1971 | Aten | 136/89 |
| 3,925,212 | 12/1975 | Tchernev | 250/527 |

OTHER PUBLICATIONS

Electronics, Mar. 21, 1974, p. 25.
M. Eisenberg et al., "Photo–Electrochemical Cells," Electrochimica Acta, vol. 5, pp. 1–12 (1961).

Primary Examiner—Anthony Skapars
Assistant Examiner—Aaron Weisstuch
Attorney, Agent, or Firm—Richards, Harris & Medlock

[57] ABSTRACT

Solar energy conversion is provided by a structure formed of a plurality of photovoltaic sources. An electrolyte wets the sources. Upon exposure to light the photovoltaic sources cause a current to flow in the electrolyte producing an electrochemical reaction. The products of this reaction may then be collected and stored. In a preferred embodiment the electrolyte is an aqueous solution of hydrogen iodide, and the hydrogen produced by the electrochemical reaction may be stored, burned as a fuel or used in a fuel cell to produce electrical energy.

9 Claims, 14 Drawing Figures

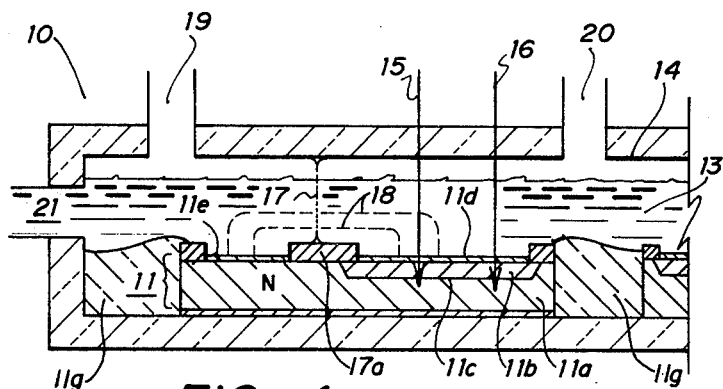
FIG. 1
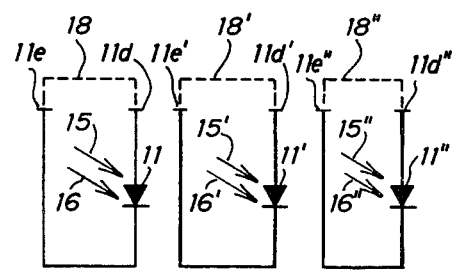
FIG. 2
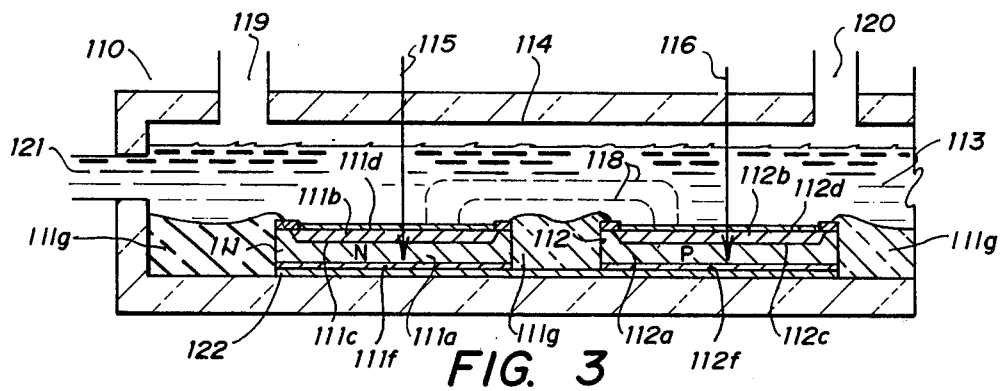
FIG. 3
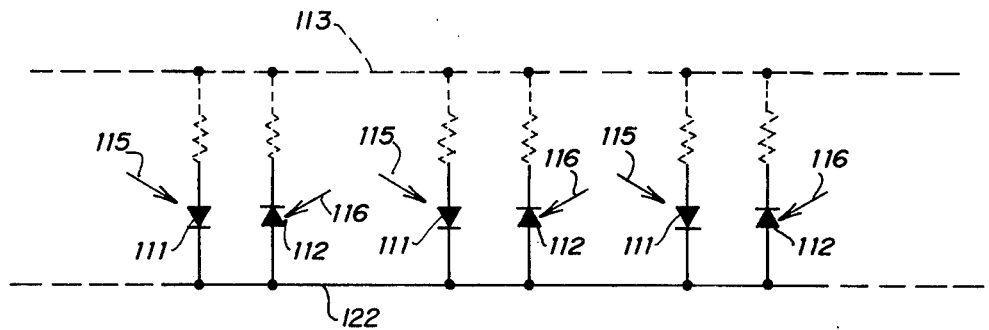
FIG. 4
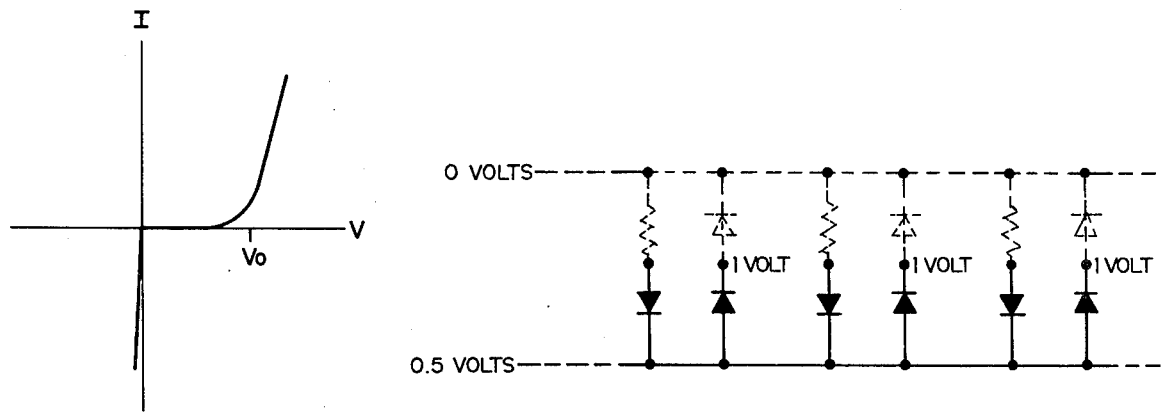
FIG. 5
FIG. 6

SOLAR ENERGY CONVERSION

This invention relates to techniques for the efficient conversion and storage of energy from optical sources such as the sun. Light falling on photovoltaic elements generates a potential which causes current to flow through an electrolyte in physical contact with the sources, producing a chemical reaction in the electrolyte.

The need for supplanting fossil fuels as an energy source is well known. There have been many systems and techniques proposed for the conversion and utilization of energy from the sun. Although significant amounts of solar energy reach the earth, relatively large areas must be collected to generate significant amounts of power. About 10 kilowatt hours per square foot per month reaches the earth at latitudes of 35°.

Since the radiation received is not continuous, means for storage of the energy received must be provided. Arrays of large area solar cells connected to banks of storage batteries have been proposed for this purpose, but four major problems are encountered in practical systems.

1. Conventional techniques for the manufacture of efficient solar cells require large amounts of semiconductor material to support and otherwise make accessible a relatively small volume of active material.
2. Semiconductor cells are basically low voltage devices requiring interconnections capable of handling thousands of amperes for kilowatt capacities.
3. Because it is necessary to connect many cells receiving solar radiation in parallel to obtain usuable outputs from large areas, flaws or leakages in a single cell can seriously degrade the performance of a large array. This causes added costs in manufacture and problems in the reliability of the finished array.
4. Since the energy from the sun must be stored to make it available when required, conventional solar cell systems are used to charge storage batteries. Such batteries are expensive, bulky and difficult to maintain.

Recently a system has been proposed in which conventional solar cells are used to operate a cell for the electrolytic dissociation of water. The hydrogen from the cell is then stored for later use. Although this procedure improves on the storage problem above mentioned, it does not contribute to a solution of the first three problems. Other attempts have been made to simplify the interconnection problem by using large sheets of single crystal silicon. In a radical departure, the present invention is embodied in a system in which all of the above problems are avoided.

The invention broadly is directed to solar energy conversion by operation of semiconductor solar generators directly in communication with and wetted by an electrolyte to force a chemical reaction. The invention is particularly concerned with the efficient conversion and storage of solar energy, and with the efficient use of materials for that purpose.

More particularly, in accordance with the invention there is provided a structure of separate elements, each of which is a semiconductor body providing a photovoltaic generator. Generator as used herein means as a device or group of devices which produce a voltage independent of the presence or absence of an electrolyte. An advantageous feature of this structure is that defective elements can be tolerated. Means are provided for illumination of the semiconductor junctions while wetting the illuminated elements with an electrolyte to produce a chemical reaction upon current flow to or from the elements through the electrolyte.

In a more specific aspect, an optical-chemical energy converter is provided wherein a layer of separate semiconductor elements is formed, each containing junctions between body and surface materials of opposite conductivity types. Some of the bodies are of p-type material and some of the bodies of n-type material. Conductor means associated with a first face of the layer connect in series the voltages generated in at least two elements having bodies of opposite conductivity types. An electrolyte containing housing encloses the layer for the illumination through the electrolyte of the junctions with optical energy impinging upon the face of the layer opposite the first face to produce electrical current flow through the electrolyte to produce chemical reaction products within the housing.

A structure containing the electrolyte houses the layer for illumination such that optical energy impinges on an active face of the elements to produce an electrical current flow through the electrolyte.

In a further aspect, the electrolyte is chosen to produce by reaction the release of hydrogen gas which may be collected and stored until required.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 is a view of a portion of one embodiment of an optical-chemical converter;

FIG. 2 illustrates the electrical equivalent of a portion of a converter formed as shown in FIG. 1;

FIG. 3 is a view of a portion of a second embodiment of an optical converter;

FIG. 4 illustrates the electrical equivalent of a portion of a converter as shown in FIG. 3;

FIG. 5 illustrates the I-V characteristic of the electrode-electrolyte interface of the devices of FIG. 4;

FIG. 6 is a simplified equivalent of the circuit of FIG. 4;

Figure 7:
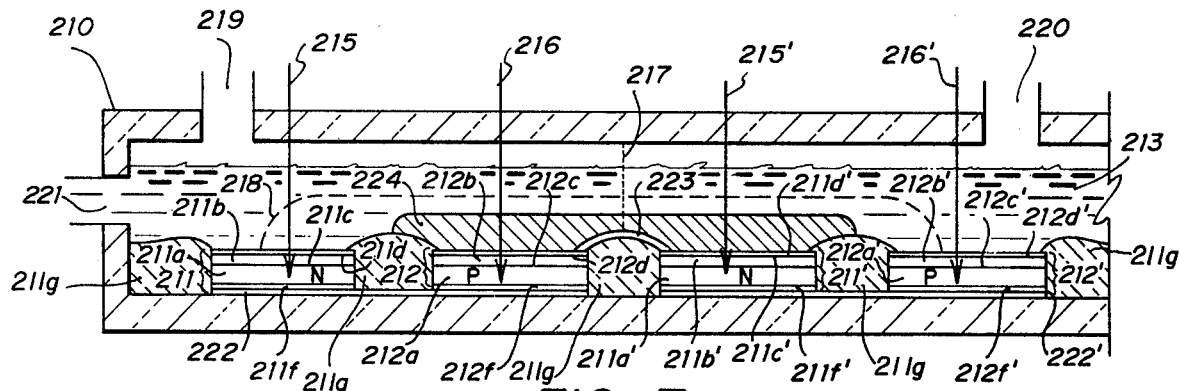
FIG. 7 is a view of a portion of a third embodiment of an optical-chemical converter.

Referring now to FIG. 1, a fraction of a solar-chemical converter 10 has been illustrated. A solar cell 11 is mounted with the upper surface thereof innundated by an electrolyte 13. The cover of converter 10 is a light transmitting sheet of a material such as glass having a lower surface 14. The upper surface of solar cell 11 is irradiated by light rays 15 and 16.

Cell 11 is a semiconductor cell in which the body 11a is formed from a material such as silicon. A diffused layer 11b is formed by conventional oxide masking and doping techniques producing junction 11c, which extends over a portion of the cell surface as shown. For example, the body may be of 0.5 to 1.0 ohm centimeter n-type silicon, and have a diffused p-type layer with a surface concentration of $10^{19}$ per cubic cm. and a junction depth of 0.5 to 1.0 micron. Transparent electrodes may be applied as indicated at 11d and 11e. Electrodes of a noble metal such as platinum or palladium may be formed by sputtering 150 Angstroms of such metal on the surface and sintering at 250° C. for 5 minutes. Alternatively, thicker opaque electrodes of these metals covering only a fraction of the exposed surface may also be used. Cell 11 is positoned between insulating bodies 11g.

Upon irradiation by light rays 15 and 16, a voltage of 0.4 to 0.6 volt will be produced at junction 11c. This potential will appear at electrodes 11d and 11e of the cell, and will cause current to flow through electrolyte 13 as indicated by dotted lines 18.

Electrolyte 13 is a liquid in which current flow produces a useful reaction at the potential available from the cell. If, for example, a silicon cell is used, the electrolyte may be nitrosyl oxychloride (NOCL). In this case, nitrous oxide is produced at the cathode electrode 11e and chlorine at the anode 11d. These products are both gases and are kept separate by a semipermeable membrane 17 anchored to insulator 17a. The nitrous oxide is extracted by way of port or outlet 19 and chlorine is extracted from port 20. Fresh electrolyte 13 is supplied through port 21. Converter 10 may operate continuously to absorb the optical energy impinging on cell 11 to cause a current to flow in electrolyte 13, producing a chemical reaction in the electrolyte for production, collection and storage of at least one reaction product.

No external electrical connections are required. If a number of cells are immersed in the same electrolyte, no connections between them are required. This is shown in FIG. 2. Because of independence of each of several cells 11, 11' and 11", an open or shorted cell will not degrade the performance of the other cells in the solution. For example, if one hundred cells are immersed in the same solution and five of them are defective, the cell output will be ninety-five percent of that obtainable with all goods cells.

Although some reactions can be driven by the potential of a single cell, other desirable reactions will require higher voltages.

FIGS. 3 and 4 show a converter 110 in which two cells 111 and 112are connected in series. Cells 111 and 112 are mounted between insulating blocks 111g with the upper surface thereof wetted by an electrolyte 113. The cover of converter 110 is a light transmitting sheet having a lower surface 114. The upper surface of cells 111 and 112 are irradiated by light rays 115 and 116.

Cell 111 is a two layer semiconductor device with an n-type body formed in a fashion similar to that described for cell 11 of FIG. 1. Upon irradiation by light ray 115, 0.4 to 0.6 volt will be produced across junction 111c of the cell 111.

Cell 112 has a p-type body 112a with a surface diffusion 112b to establish a junction 112c. This diffusion preferably provides an n-type layer with a surface concentration of about $10^{19}$ per cubic cm. and a junction depth of about 0.5 to 1.0 micron. Transparent platinum or palladium electrodes 111d and 112d may be applied by the process used for cell 11, FIG. 1.

Upon irradiation by light rays 116, cell 112 will produce about 0.5 volt across junction 112c. A metallic layer 122, which may of a aluminum, provides an ohmic contact to the bottom surface of cells 111 and 112. An n+ diffusion, shown as 111f, and a p+ diffusion, shown as 112f, may be used to assure ohmic contact to the cells. The operation of the cells is such that when irradiated by optical energy as indicated by light rays 15 and 16, current will flow from cell 111 through conductor 122 to cell 112 and return through a path through the electrolyte as such as that indicated by lines 118.

Because cell 111 is connected in series with cell 112, a voltage of about one volt is produced between electrode 111d and electrode 112d when the cells are exposed to light. The electrolyte 113 is a liquid in which current flow produces a desired reaction at this voltage. In a preferred embodiment, electrolyte 113 may be a 10% of hydroiodic acid (HI) in water. In this case the current through the electrolyte produces hydrogen at cathode electrode 112d and iodide ions at anode electrode 111d. The hydrogen may be extracted from the converter 110 by means of port or outlet 120. The iodide ions will remain in solution and may be removed through port 121. New electrolyte may be supplied through port 119. In this case, converter 110 operates from the optical energy of rays 115 and 116 impinging on cells 111 and 112 by causing a current to flow in electrolyte 113, thus producing hydrogen and iodine from the electrolyte. Because only one of the end products is a gas, no membrane is required to separate the end products. For some reactions, however, it may be desirable to include one to prevent the diffusion of ions between the electrodes, which would constitute a form of chemical short-circuiting. Alternatively, it may be desirable to provide a physical separation between the anodes and the cathodes for this purpose.

As indicated in FIG. 4, additional pairs of cells may be immersed in the same electrolyte 113. Metal conductor 122 may be extended to provide a lower contact for all of the cells in the solution, if desired; alternatively, a conductor may be provided for both pair. An equivalent circuit for the case where all of the cells are connected to a common lower contact 122 is shown in FIG. 4. Cells 111 have an n-type bulk material and cells 112 have p-type bulk. The light rays which energize these cells are indicated by arrows 115 and 116, respectively.

Each cell in contact with electrolyte 113 sees a non-linear impedance Z which has a characteristic similar to that shown in FIG. 5. For hydroiodic acid solution $V_0$ is about 0.5 volt.

An approximation of this circuit is shown in FIG. 6 where those impedances which are forward biased are replaced in the circuit by diodes and those reverse biased by a small resistance.

From this circuit it is apparent that some cells may be either open circuited or short circuited without affecting the other cells in reactor 110, FIG. 3. If a cell of either polarity is open circuited, its output is lost but has no effect on the output of other cells in the solution. Similarly, if a cell of either polarity is short circuited, it becomes biased at 0.5 volt with respect to the solution. FIG. 5 makes it clear that little current will flow under these conditions, but again the other cells will not be affected. For this reason, therefore, if one hundred n-type and one hundred p-type cells are connected as shown in FIG. 4, five percent of the n-type and five percent of the p-type cells can be defective without reducing the output more than about five percent.

Figure 8:
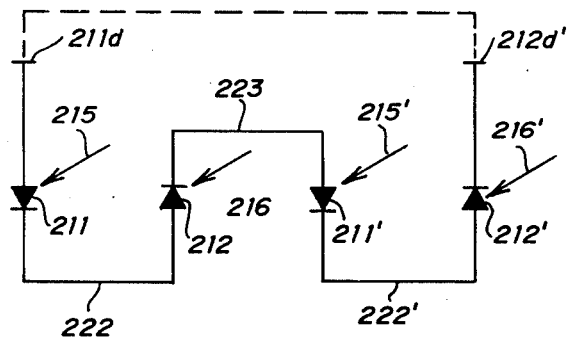
FIG. 8 illustrates the electrical equivalent of the portion shown in FIG. 7.

For still other desired reactions even higher voltages may be generated. For example, the efficient electrolysis of water requires more than two volts. This can be provided by the structure shown in FIG. 7. In this case two pairs of cells provide the required voltage. Each cell pair may be identical to those of FIG. 3. One such cell pair is shown in FIGS. 7 and 8 as cells 211 and 212, and the other pair of cells 211' and 212'. Cells 211, 212, 211' and 212' are mounted between insulating blocks 211g. A series connection between the pairs is provided by a metallic layer 223 which makes an ohmic contact to the surface layers of cells 212 and 211'. This layer may be of aluminum.

All four cells are exposed to light rays 215, 216, 215' and 216'. The cells will generate a voltage of about two volts betwee the anode 211d and the cathode 212d. The two center cells 212 and 211' are exposed to light but not to the solution and are protected by a transparent layer of epoxy 224.

If water is used as the electrolyte, hydrogen will be liberated at the cathode 212d' and oxygen at the anode 211d. Because both products are gases, a semipermeable membrane 217 is used. The hydrogen is removed through port 220 and oxygen through port 219. Make up water is supplied through port 221 so that a continuous reaction is maintained.

The examples given are illustrative, and it should be clear that a number of modifications and substitutions are quite feasible. Other semiconductors such as gallium arsenide and germanium may be substituted for silicon. Similarly, although p-n junction photovoltaic generators have been described, other structures such as Schottky-barriers and MOS devices may be used to generate a voltage from the optical source. The higher voltages required for some reactions may be obtained by connecting identical cells in series, as well as by the technique of mixing cell polarities described. Finally, the exaples given should make it clear that the reactions obtainable by this new technique are not limited to a single class of chemical compounds.

It should also be apparent that a significant reduction in the cell interconnections has been realized. It is not necessary to bring heavy interconnections from the cell. The single cell structure of FIG. 1 requires no internal interconnections, and the two cell version of FIG.3 requires only one. This simplification makes it possible to consider economical structures made up of large numbers of small cells. This is a significant departure from the conventional approaches, which have usually attempted to achieve lower costs through ever larger junction areas.

Figure 9:
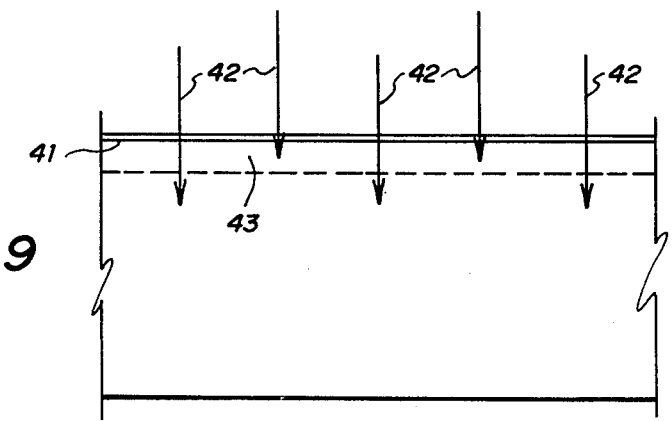
FIG. 9 is a sectional view of a conventional semiconductor photovoltaic cell construction.

The use of smaller cells permits higher efficiencies. This fact is illustrated by comparison of the partial representations of semiconductor structures in FIGS. 9 and 10. FIG. 9 illustrates a conventional planar cell structure with junction 41 about one micron below the surface. Carriers generated by light rays 42 will be produced in the cell to a depth of about 100 microns, although only those generated within a diffusion length of a junction will be collected. For good quality silicon crystals, a diffusion length is about 35 microns. A layer 43 of about that thickness is shown in FIG. 9. Layer 43 represents the active portion of the device. Provision of an active layer of this thickness requires the use of rather thick wafers, and silicon is usually cut about 300 microns thick to provide the necessary handling strength. For such wafers, only about 35/300 or 12% of the material is useful in producing current. If the wafers are sawed from a larger crystal and saw losses are taken into account, the useful part of the wafer is about 4% of the starting material.

Figure 10:
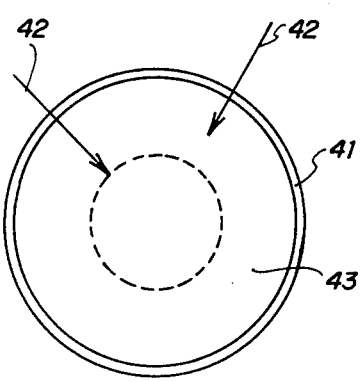
FIG. 10 illustrates more efficient use of semiconductor material in the present invention.

A much more efficient structure is shown in FIG. 10. For a sphere 100 microns in diameter, more than 97% of the material is within a diffusion length of a junction, and for spheres 200 mirons in diameter about 73% of the material is within a diffusion length and therefore potentially useful. Although spheres are particularly advantageous for the purpose, the efficiencies of small cubes and rectangular shapes are also substantially better than those of the large planar surfaces which are used in conventional structures.

Figure 11:
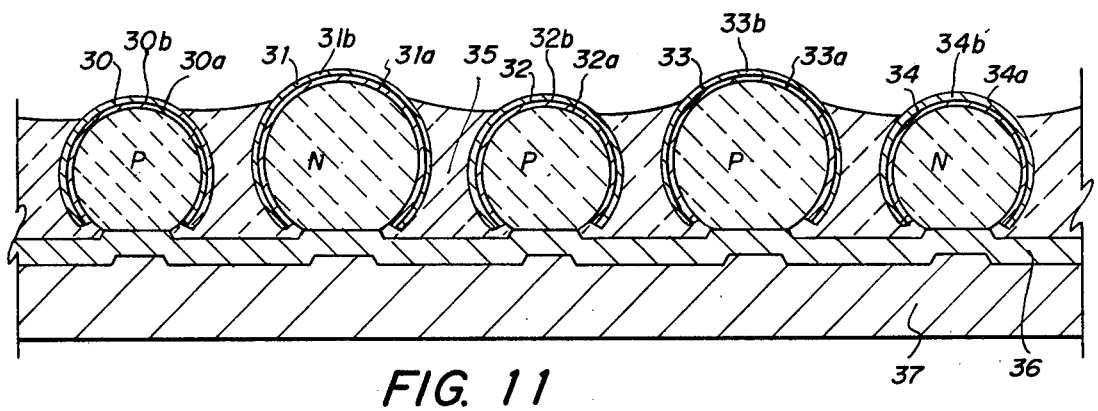
FIG. 11 is a section of a fraction of a photoelectric strip generator in accordance with one embodiment of the invention.

It is difficult to utilize small cells with interconnection techniques which require two connections per cell and heavy leads to handle the large currents produced by an array. A reduction in the number of contacts required per cell makes it possible to consider alternate interconnection techniques. One such structure for this purpose is shown in FIG. 11. In this embodiment, a plurality of partial spheres 30-34 form a portion of one row of a sheet of such spheres. Spheres 30, 32 and 33 have cores of p-type semiconductor material. Spheres 31 and 34 have cores of n-type material. The cores have surface diffusions 30a-34a, respectively, forming p-n junctions in each sphere. These junctions are also spherical. Spheres 30-34, of different sizes, are integrated in a matrix 35 of an insulating material which may be a silicon resin. The lower portions of each of the spheres are removed to expose the core material. Insulator 35 separates the spheres and covers and protects the junctions formed by the diffused layers. A metallic conductor 36 forms an ohmic contact with the core of each sphere 30-34 and interconnects the spheres into a structure comparable to that of FIG. 3. A second layer 37 provides a common support for the entire matrix and provides a protective layer for metallic conductor 36. The silicone matrix 35 and the other surface materials associated with each of the spheres are light transmissive so that incident optical energy will irradiate the entire upper half of each of spheres 30-34. Some reflections from metallic layer 36 will also occur, and some reflected light will reach the lower halves of the spheres. The upper surfaces of the spheres are provided with electrodes 30b-34b, respectively, and are exposed so that all electrodes individually are wetted by the electrolyte when placed in a converter.

Figure 12:
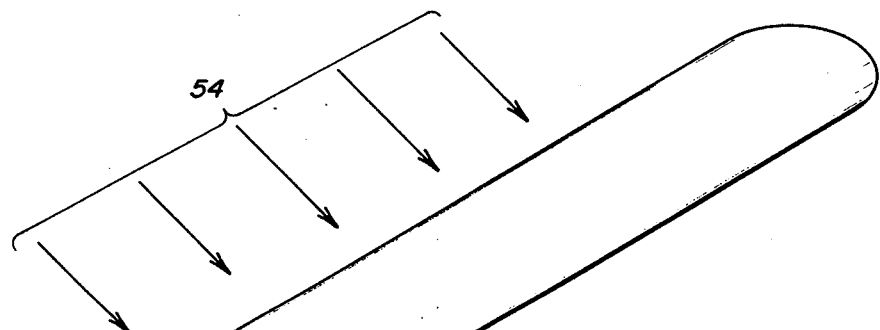
FIG. 12 is an isometric view of an elongated tubular electrolytic converter embodying the invention.

FIG. 12 illustrates one form of a converter in which a strip or sheet of solar cells such as those illustrated in FIG. 11 is housed to convert solar radiation into electrical current and thus force a chemical reaction within the converter. An elongated hollow elliptical tube 50 of glass is provided with a base portion 51 on which there reposes an elongated strip or sheet 52 of solar cells. The upper portion 53 is selectively shaped to provide cylindrical lensing action so that incident radiation as indicated by ray paths 54 will be refracted to impinge the upper surface of solar cell strip 52.

Figure 13:
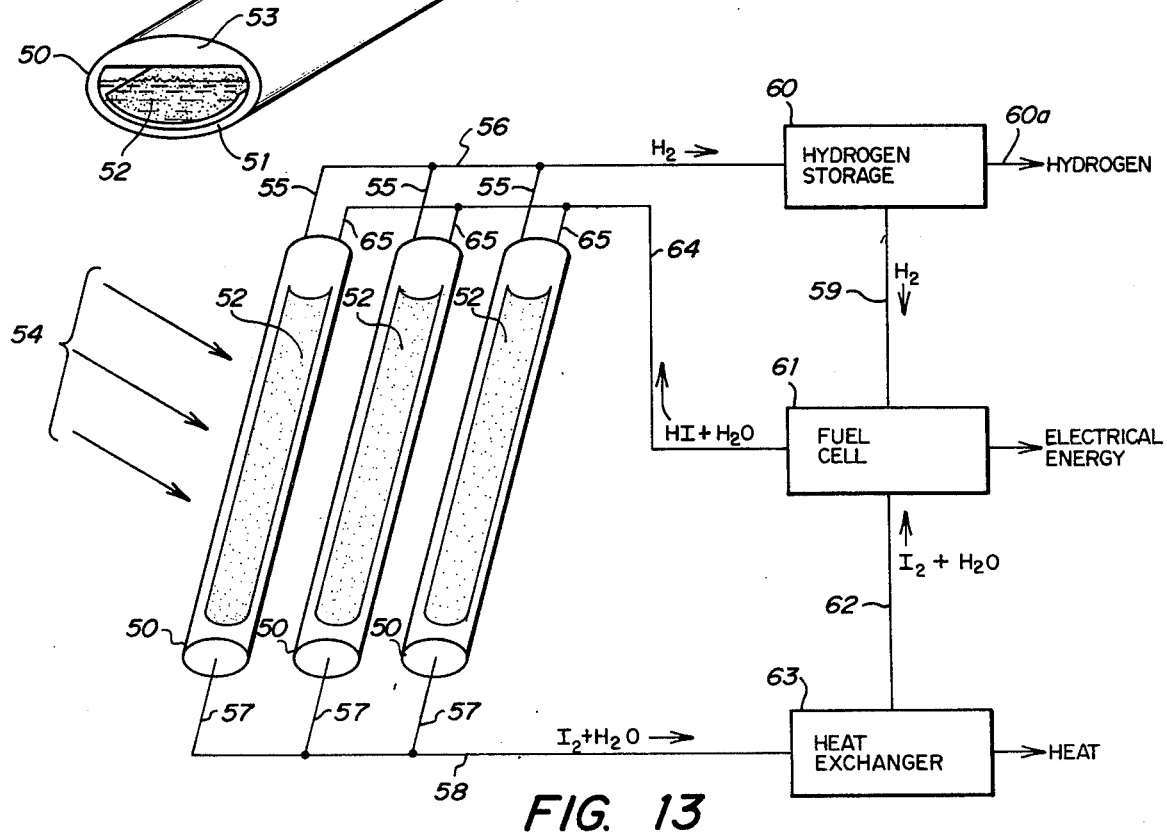
FIG. 13 is a functional block diagram of a system incorporating the invention.

An illustrative embodiment of one form of a complete system using such tubes is shown in FIG. 13. A series of tubes 50 are mounted with their axes inclined. Strips 52 repose on the bottom of each tube 50. In a preferred embodiment, the electrolyte is an aqueous solution of hydrogen iodide, and the reaction within each tube may be written as:

$$2HI + H_2O + \text{Electrical Energy} \rightarrow H_2 + I_2^- + H_2O \quad (1)$$

The $I_2$ thus produced may be considered to exist as triiodide ($I_3^-$) which forms by reaction with the iodide ($I^-$) ions from the HI. In any event the products of this reaction, hydrogen and tri-iodide ions, are removed by manifolds 56 and 58. The hydrogen collected in manifold 56 is transported to a storage unit 60 where it may either be compressed and stored as a gas or in the form of a hydride. A suitable hydride storage process has been described by a number of authors such as Wiswall and Reilly of Brookhaven National Laboratory.

The iodine is effectively stored in the electrolyte and may be transported by tubes 57 to manifold 58.

If desired, electrical energy can be obtained from the system by recombining the hydrogen and iodine in a fuel cell 61. Fuel cells for hydrogen-halogens have been built by W. Glass of Ionics, Inc., Cambridge, Mass. and are described in the final report of Contract AF 19 (604)-8508. In the fuel cell, the reaction will then be:

$$+H_2 + I_2 + H_2O \rightarrow 2HI + H_2O + \text{Electrical Energy} \quad (2)$$

The hydrogen is transported to fuel cell 61 by means of tube 59, while the iodine is transported in an aqueous solution by tube 62. Because the solution in the array of tubes 50 will also be heated by the rays 54 of the sun, energy in the form of heat may be taken from the system by a conventional heat exchanger 63. The recombined products from the fuel cell 61 may then be returned to tubes 50 by means of mainfold 64 and tubes 65.

The system of FIG. 13 is a closed system capable of continuous operation. With materials such as hydroiodic acid, it is efficient because the charge reaction can be carried out without detectable electrode overpotential and the discharge reaction can be carried out without detectable electrode polarization. As a result the reactions $$H_2 + I_2 + H_2O \rightarrow 2HI + H_2O + \text{Electrical Energy} \quad (3)$$

can be made to approach thermodynamic reversibility very closely, thus providing an efficient energy storage and supply system.

For other applications, it may be desirable to use a system of this type for the production of hydrogen. If desired, hydrogen may be extracted from manifold 56 or from storage unit 60 as indicated by tube 60a. If hydrogen is removed from the system, it will be necessary to modify the system. This may be done by replacing fuel cell 61 by a unit in which hydrogen sulfide is bubbled through the tri-iodide ions, forming new hydroiodic acid which is returned to the solar converters through manifold 64. If desired, the hydrogen sulfide may be formed from hydrogen from manifold 56, or may be supplied from an external source.

Applications for systems of either type are likely to require hundreds or even thousands of square feet of solar cell strips. Efficient fabrication of this element of the system is of paramount importance. Such strips must be producible on an economically feasible basis with efficient utilization of the materials. Although strips of this type may be formed using thin film techniques, higher efficiencies are attainable using small particles.

Figure 14:
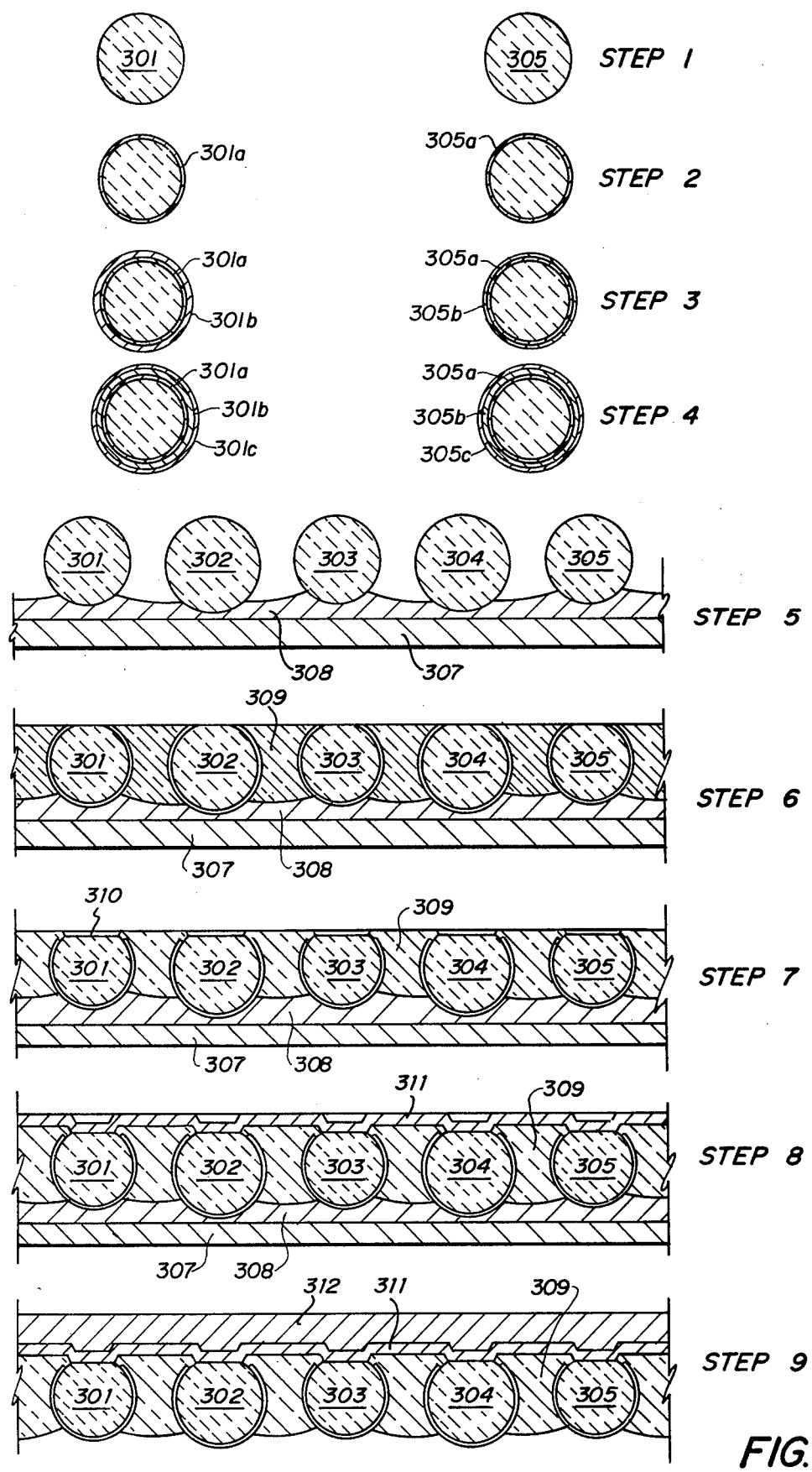
FIG. 14 illustrates a process for forming a photoelectric strip generator.

FIG. 14 illustrates a fabrication process for the production of solar cell strips such as those shown in FIG. 11.

In Step 1, spheres 301–305 silicon are formed. Although the spheres could be prepared by grinding, it is possible to use a process similar to that used for making lead shot. Silicon doped to about $5 \times 10^{17}$ per cc is melted in a tube and forced through a nozzle. Silicon droplets are formed and permitted to fall through a distance of about eight feet. During this fall the silicon solidifies, forming a basically spherical shape with a small cone projecting from the last portion of the sphere to solidify. This departure from sphericity is of no significance in the process, although it may be desirable to redistribute the impurity concentration by heating the spheres for 12 hours at 1300° C. Both p-type and n-type spheres are required for the structure of FIG. 11 and both may be prepared in this manner. Although some of the spheres may have integral grain boundaries, and thus not be true single crystals, most will be suitable for this application. The spheres may then be sorted by diameter. Although any diameter may be used, it is advantageous to work with spheres with a limited variation in size at any one time. For example, in the fabrication process to be described the spheres are sorted into groups within 0.001 inch diameter variation.

In Step 2, spheres 301–305 are diffused to provide the necessary junctions between surface layers 301a–305a and the body of the material. The p-type spheres are given an n-type surface layer. This may be accomplished by a gaseous diffusion process with a phosphorus source. The desired layers 301a–305 a preferably will have junction depths of about one-half to one micron and surface concentraions of about $10^{19}$ per cc. The n-type spheres are given a p-type surface layer, using a similar diffusion process with a boron source. The resulting p-layers will also have a junction depth of about 0.5 to 1.0 micron and a surface concentration of about $10^{19}$ per cc. Diffusion processes suitable for the purpose are well known to those skilled in the semiconductor art.

In Step 3, metal contacts 301b–305b applied to the surface of the spheres. Although the choice of a metal may depend upon the electrolyte, platinum is suitable for use with any of the examples given in this application. A thin transparent layer of platinum is formed by sputtering 150 Angstroms onto the surface of the spheres. The spheres are agitated in the sputtering system to assure coverage of the entire surface. The platinum is then sintered at 250° C. for 5 minutes, forming an ohmic contact with the surface layer of both types of spheres.

In Step 4, thin insulating coatings 301c–305c are applied to the spheres. An 0.0005 inch thick layer of an acrylic material such as manufactured and sold by DuPont and identified as Krylon Acrylic 1302 is suitable for this purpose. This layer is not required if (a) the spheres are spaced apart in the subsequent fabrication process, or (b) p-type spheres are not in contact with n-type spheres.

In Step 5, with insulating coatings 301c–305c the p-type and n-type spheres may be mixed and spread upon a temporary substrate. Spheres 301–305 are supported on a temporary substrate 307 which has previously been coated with an 0.002 inch thick layer 308 of paraffin wax. Substrate 307 is heated slightly and the spheres are pressed into the wax layer. The spheres will be held in place by wax 308 during steps which follow.

In Step 6, the substrate and spheres are flooded with a layer of insulating compound 309. Choice of this material will depend in part on the electrolytes chosen, for it should not deteriorate in use. For the examples given, a transparent silicone resin made by the General Electric Company, Catalog No. RTV-108, has been found satisfactory. A transparent resin is desirable since it permits light to reach more of the surface of the spheres. After the resin 309 is cured, the top surface is removed exposing the body portions or cores of spheres 301-305.

In Step 7, the exposed cores are then etched, using etch in the ratio by volume of $HNO_3$ to HF of 250 to 4 with trialkyl amine added at 5% of the solution. This removes layer 310 of silicon of about 0.0005 inch thick and cleans up the junctions. By use of an etch with concentration preferential qualities, the junctions may be depressed even further than can be indicated on a drawing of the scale of FIG. 14.

In Step 8, after etching, the surface of the sheet is heated, causing the feather edges of silicone resin at the top surface of the spheres to sag over and to protect the exposed junctions. The sheet is then placed in an ion plating system of the type described by Hale, White & Meyer in "Electronic Packaging and Production", May 1975 pp. 39-45, and a fifty microinch thick layer 311 of metal, preferably aluminum, is deposited over the entire surface of the sheets. Layer 311 contacts the cores of all of spheres 301-305. If desired, the surface exposed by removal of layer 310 may be mechanically abraded or exposed to an ion-implantation source prior to ion plating to facilitate achievement of ohmic contacts.

In Step 9, after removing from the metalizing system, the sheet is coated with an additional layer 312 of material for added strength and to protect the metal layer. Layer 312 may also be formed of silicone resin identical to that indicated at 309, although transparency is not a requirement. After layer 312 has been applied and cured, substrate 307 is removed. The lower surface of the sheet is then washed in a solvent such as trichlorethelyne to remove the paraffin 308 and the acrylic lacquer of Step 4 from the exposed surface of spheres 301-305.

It will be recognized that the ultimate structure resulting from the completion of Step 9 is in general the same as the structure of FIG. 11. After completion of the process, the resulting sheets of material are cut into strips 52, FIG. 12, and inserted into tubes 50 for use as a solar converter.

It should also be recognized that all of the processes required could be carried out in either batch or a continuous form. Continuous processes are usually advantageous from an economic standpoint and can readily be used with the procedure described. In this case, the temporary substrate 307 would be a wide belt of stainless steel and would be used to carry the sheet through the subsequent processes, following which the structure is removed from the belt as a continuous strip as shown in Step 9. The strip is then mounted to receive radiation on the face opposite layers 311 and 312.

Although the use of small spheres is believed to be particularly advantageous, photovoltaic sources of any shape may be used to advantage with the invention. For example, it would be feasible to construct strips 52 using thin film techniques. In this case thin film layers of a semiconductor material would be deposited on thin sheets of a metal, as described by Fang, Ephrath and Nowak, Applied Physics Letters, Vol. 25, No. 10, November 1974, pp. 583-584; or by the deposition of a semiconductor such as silicon on a substrate such as sapphire by techniques which are well known to those skilled in the art. If the semiconductor films are divided into independent photogenerators of small area, the fault tolerant operation would be maintained.

The photovoltaic sources, while not limited as to shape, also are not limited to PN junctions. For example, Schottky barrier devices may be employed. Schottky barriers comprise a metallic layer directly on a surface of a semiconductor body. The body material and the metal are chosen so that there is a barrier at the metal semiconductor interface which becomes conductive when illuminated. Photovoltaic sources are well known and may be fabricated with Schottky barrier junctions. Processes to produce Schottky barrier cells are described by Anderson and Milano, Proceedings of IEEE, January 1975, p 206-207. For use with the electrolytes described in this application, platinum should be substituted for the aluminum finger contacts used by Anderson and Milano.

In each case, selected areas of the photovoltaic devices are wetted by the electrolyte in which the chemical reaction takes place. By wetting, it is meant for the purpose of the present application that an electrolyte is in physical and electrical contact with at least selected areas of the photovoltaic cells.

In the drawings above described, it is noted that the light impinging the photovoltaic cells passes through the electrolyte. While this is a convenient geometrical arrangement and is preferred, it will be readily recognized that the photovoltaic cells may be so constructed as to receive light other than through the electrolyte while still being wetted by the electrolyte for current flow from the cells to produce the desired chemcial reaction.

It should, therefore, be understood that the described embodiments are illustrative of the invention. Other arrangements may be devised by those skilled in the art without departing from the spirit and scope of the invention as defined by the appended claims.

What is claimed is:
1. An energy converter which comprises:
   a. a plurality of photovoltaic generators,
   b. an electrolyte in physical contact with said generators, and
   c. means for exposing said generators to light, causing an electric potential to be developed by said generators which will cause current flow through said electrolyte to produce an electro chemical reaction in said electrolyte.
2. The combination set forth in claim 1 wherein said generators comprise semiconductor junctions formed between semiconductors of opposite conductivity type.
3. The combination set forth in claim 1 wherein said generators comprise Schottky barrier junctions.
4. The combination set forth in claim 1 wherein a plurality of said generators are connected in series circuit relation.
5. The combination set forth in claim 1 wherein a fraction of said generators are to comprise p over n semiconductors and the rest comprise n over p semiconductors.
6. An energy converter which comprises:
   a. a plurality of photovoltaic generators, b. means for exposing said generators to light for causing electric potentials to be developed by said generators,
c. means for receiving an electrolyte for wetting said generators and constituted to respond to current flow through the electrolyte to produce a desired electro chemical reaction in the electrolyte.

7. In an energy converter, the combination which comprises:
   a. a structure formed of a plurality of separate elements in a layer wherein each of said separate elements comprises a photovoltaic generator,
   b. electrolytic cell means adapted to contain an electrolyte and enclosing said structure, and
   c. means for illuminating said generators by optical energy passing through the electrolyte to produce electrical current flow through the electrolyte to cause a chemical reaction within said converter.

8. An optico-electro chemical energy converter which comprises:
   a. a layer of separate semiconductor elements each forming a photovoltaic generator wherein each contains a junction between body and surface materials of opposite conductivity types with some of the bodies of p-type materials and the rest of the bodies of n-type material,
   b. conductor means associated with a first face of said layer for connecting in series the voltages generated in at least two of said elements having bodies of opposite conductivity types,
   c. a cell adapted to contain an electrolyte enclosing said layer, and
   d. means for illuminating said junctions with optical energy impinging from the face of said layer opposite said first face to produce an electrical current flow through an electrolyte in said cell to cause an electro chemical reaction within said cell.

9. The combination set forth in claim 8 wherein said elements are substantially uniformly sized and secured in a binder layer with a portion of the body material of each element connected to said conductor means and terminal means on said opposite face of said layer, said terminal means being transmissive of optical energy for passage through the junction associated with each said element.

* * * * *

UNITED STATES PATENT AND TRADEMARK OFFICE
CERTIFICATE OF CORRECTION

PATENT NO. : 4,021,323
DATED : May 3, 1977
INVENTOR(S) : Jack S. Kilby et al

It is certified that error appears in the above-identified patent and that said Letters Patent are hereby corrected as shown below:

```
Title should be --RADIANT ENERGY CONVERSION--.
Under "References Cited" include --Nature, Vol. 238, July 7,
                  1972, pp. 37 and 38--.
Col. 1, line 63, cancel "as" (second occurrence).
Col. 3, line 48, "goods" should be --good--;
        line 57, "surface" should be --surfaces--.
Col. 4, line 5, "may of a" should be --may be of--;
        line 21, after "10%" insert --solution--;
        line 44, "both" should be --each--.
Col. 5, line 21, "betwee" should be --between--;
        line 21, "212d" should be --212d'--;
        line 43, "exaples" should be --examples--.
Col. 6, line 34, "silicon" should be --silicone--.
Col. 7, line 14, after "Energy" insert --→--;
        line 24, before "2HI" insert --→--;
        line 33, "mainfold" should be --manifold--;
        line 43, before "2HI" insert --→--.
Col. 8, line 4, before "silicon" insert --of--;
        line 16, "spheres" should be --sphere--;
        line 19, "integral" should be --internal--;
        line 33, "301a-305 a" should be --301a-305a--;
        line 44, before "applied" insert --are--.
```

Signed and Sealed this sixteenth Day of August 1977

[SEAL]

Attest:

RUTH C. MASON
Attesting Officer

C. MARSHALL DANN
Commissioner of Patents and Trademarks